(12) United States Patent
Barker et al.

(10) Patent No.: US 8,038,795 B2
(45) Date of Patent: Oct. 18, 2011

(54) EPITAXIAL GROWTH AND CLONING OF A PRECURSOR CHIRAL NANOTUBE

(75) Inventors: Delmar L. Barker, Tucson, AZ (US); William R. Owens, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 653 days.

(21) Appl. No.: 12/174,356

(22) Filed: Jul. 16, 2008

(65) Prior Publication Data

US 2010/0012021 A1 Jan. 21, 2010

(51) Int. Cl.
*C30B 25/18* (2006.01)
(52) U.S. Cl. ............... 117/87; 117/88; 117/94; 117/97; 117/99; 117/100; 117/101; 117/106; 977/722; 977/734; 977/740; 977/742; 977/748; 977/750; 977/751
(58) Field of Classification Search ............... 117/87, 117/88, 94, 97, 99, 100, 101, 106, 902, 913, 117/920; 977/722, 734, 740, 742, 748, 750, 977/751
See application file for complete search history.

(56) References Cited

U.S. PATENT DOCUMENTS

| | | | |
|---|---|---|---|
| 6,838,297 B2* | 1/2005 | Iwasaki et al. | 438/20 |
| 7,211,143 B2* | 5/2007 | Yang et al | 117/84 |
| 2005/0118494 A1* | 6/2005 | Choi | 429/43 |
| 2008/0268288 A1* | 10/2008 | Jin | 428/800 |
| 2008/0311025 A1* | 12/2008 | Smalley et al. | 423/447.3 |
| 2009/0060827 A1* | 3/2009 | Vinciguerra et al. | 423/447.1 |
| 2009/0087493 A1* | 4/2009 | Dai et al. | 424/490 |

OTHER PUBLICATIONS

J. Coraux, et al. in "Structural coherency of graphene on Ir(111)," Nano Letters 8, 565 (2008).*
P.M. Ajayan in "Nanotubes from carbon," Chem. Rev. 99, 1787 (1999).*
Daenen et al., The wonderous world of carbon nanotubes, Eindhoven University of Technology, Feb. 27, 2003, pp. 1-23.
Striemer et al., Charge- and size-based separation of macromolecules using ultrathin silicon memranes, 2007 Nature Publishing Group, pp. 749-753.
P.M. Ajayan, Nanotubes from carbon, 1999 American Chemical Society, May 1, 1999, pp. 1787-1799.
Klusek et al., Local electronic edge states of graphene layer deposited on Ir(111) surface studied by STM/CITIS, Appl Surface Science 252 (2005) pp. 1221-1227, Elsevier Science.
Gall et al., Intercalation of nickel atoms under two-dimensional graphene, Carbon 38 (2006) pp. 663-667, Elsevier Science Ltd.

(Continued)

*Primary Examiner* — Michael Kornakov
*Assistant Examiner* — Kenneth A Bratland, Jr.
(74) *Attorney, Agent, or Firm* — Eric A. Gifford

(57) ABSTRACT

A precursor chiral nanotube with a specified chirality is grown using an epitaxial process and then cloned. A substrate is provided of crystal material having sheet lattice properties complementary to the lattice properties of the selected material for the nanotube. A cylindrical surface(s) having a diameter of 1 to 100 nanometers are formed as a void in the substrate or as crystal material projecting from the substrate with an orientation with respect to the axes of the crystal substrate corresponding to the selected chirality. A monocrystalline film of the selected material is epitaxially grown on the cylindrical surface that takes on the sheet lattice properties and orientation of the crystal substrate to form a precursor chiral nanotube. A catalytic particle is placed on the precursor chiral nanotube and atoms of the selected material are dissolved into the catalytic particle to clone a chiral nanotube from the precursor chiral nanotube.

20 Claims, 10 Drawing Sheets

OTHER PUBLICATIONS

Coraux et al., Structural coherency of graphene on IR(111), Nano Letters (2008) vol. 8, No. 2, pp. 565-570, 2008 American Chemical Society.

Makarenko et al., Ultrahigh-vacuum STM studies of the structure of a graphene layer on the IR(222) surface, Physics (2007) vol. 71, No. 1, pp. 52-55, Allerton Press.

Sutter et al., Epitaxial graphene on ruthenium, Nature Materials, vol. 7, May 2008, 2008 Nature Publishing Group.

Smalley et al., Single wall carbon nanotube amplification: en route to a type-specific growth mechanism, J. Am. Chem. Soc. 2006, 128, pp. 15824-15829.

N'Diaye et al., Structure of epitaxial graphene on Ir(111), New Journal of Physics 10 (2008) 043033, pp. 1-16, IOP Publishing Ltd.

* cited by examiner

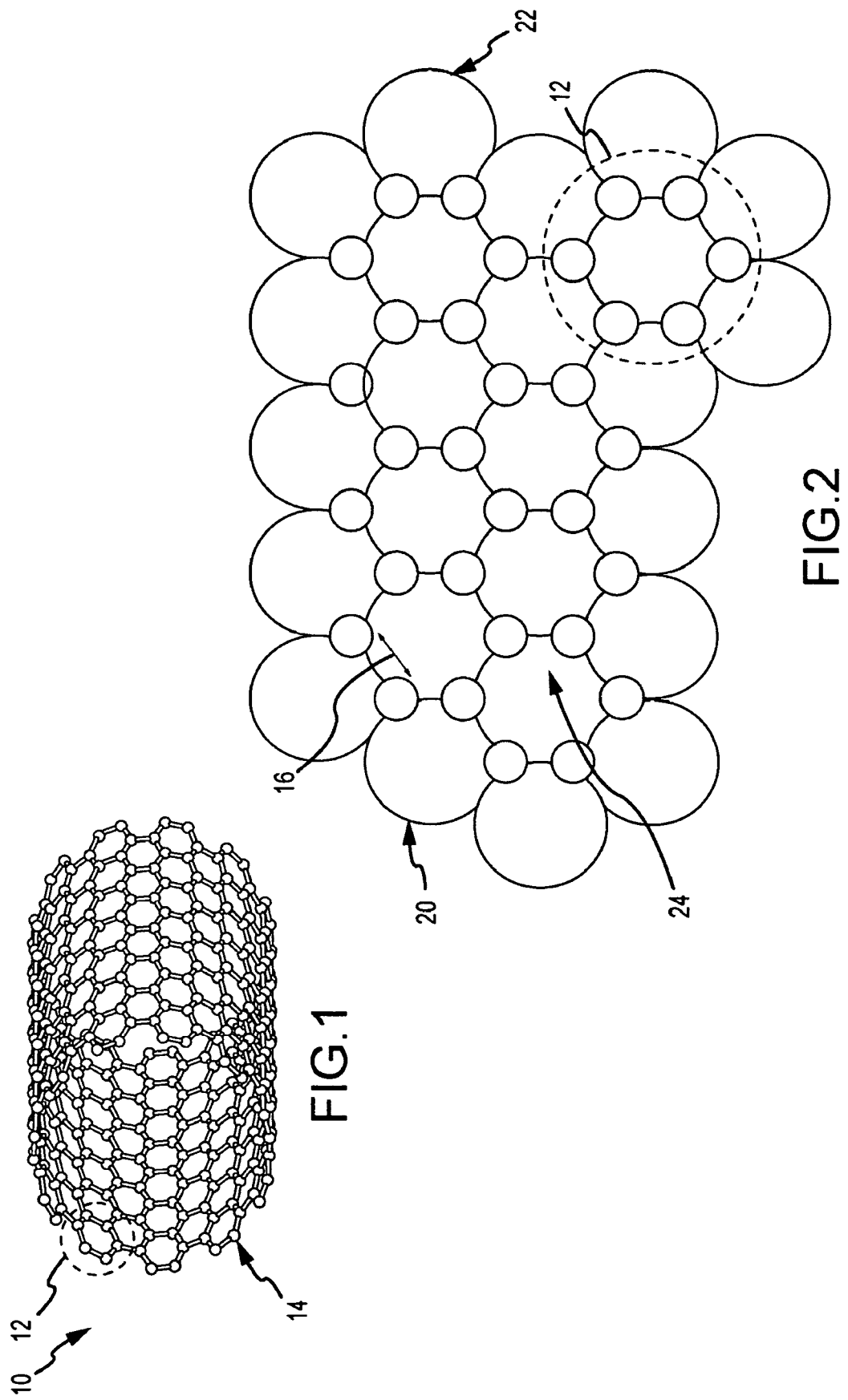

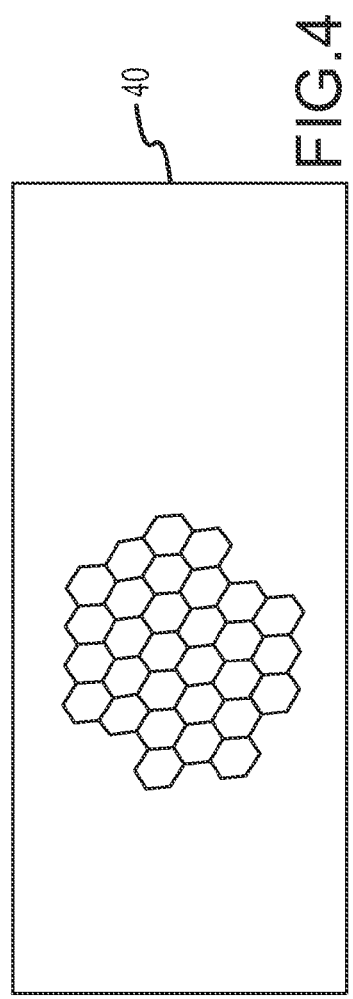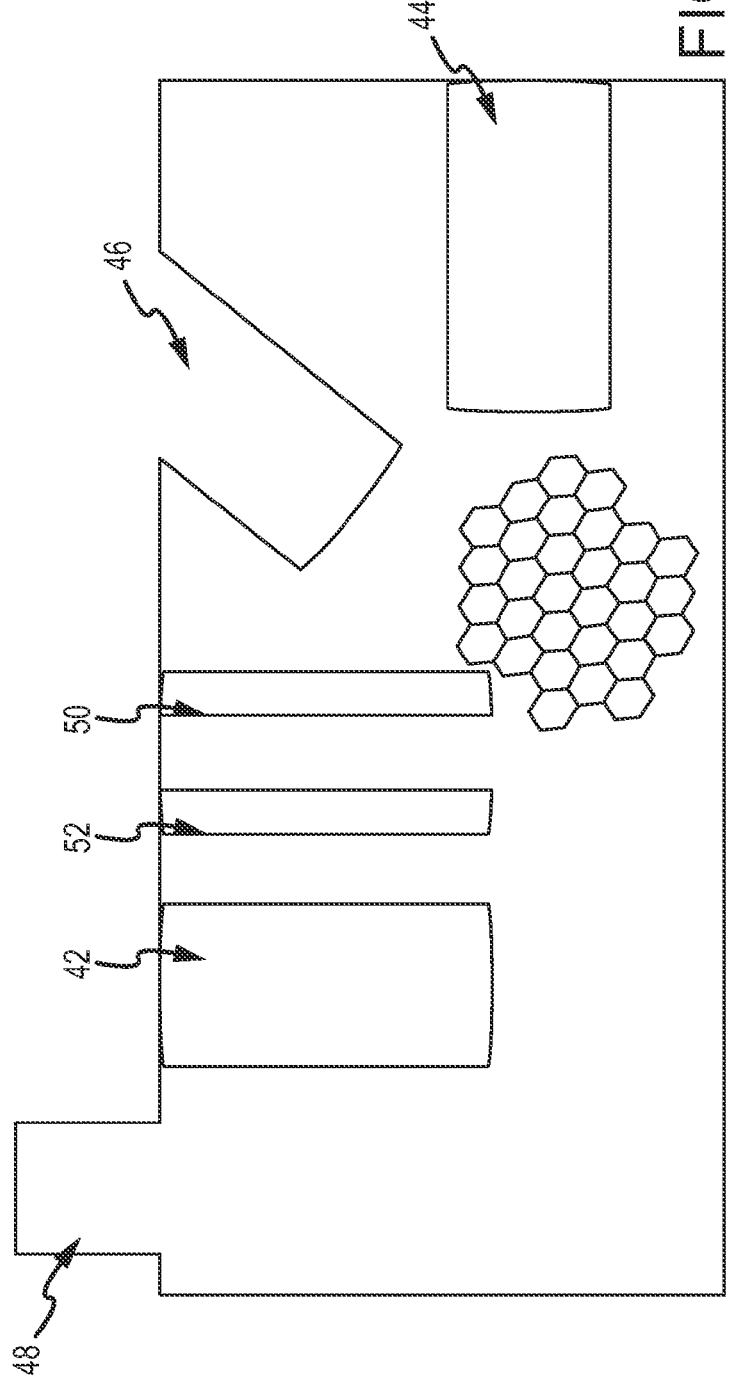

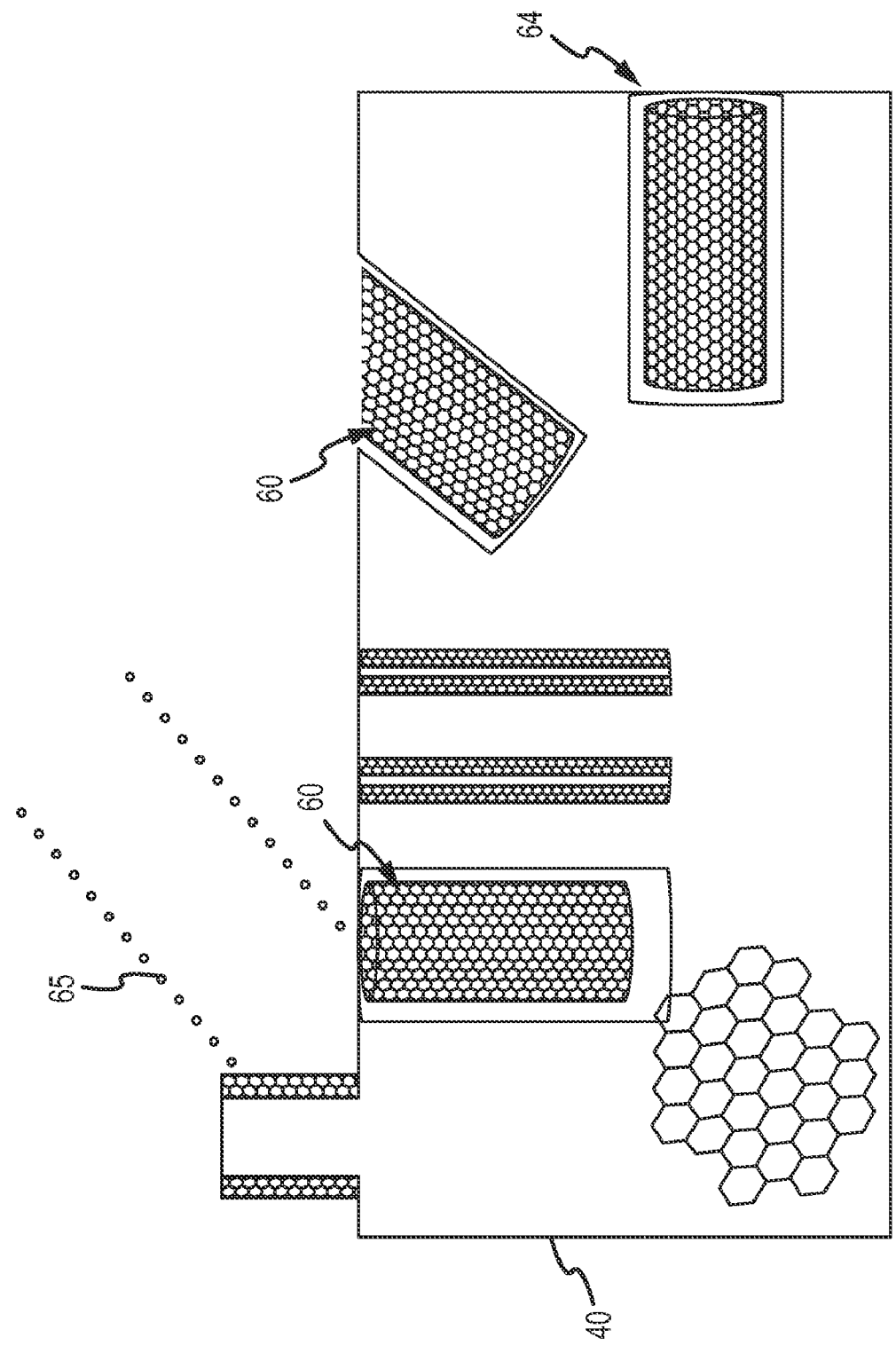

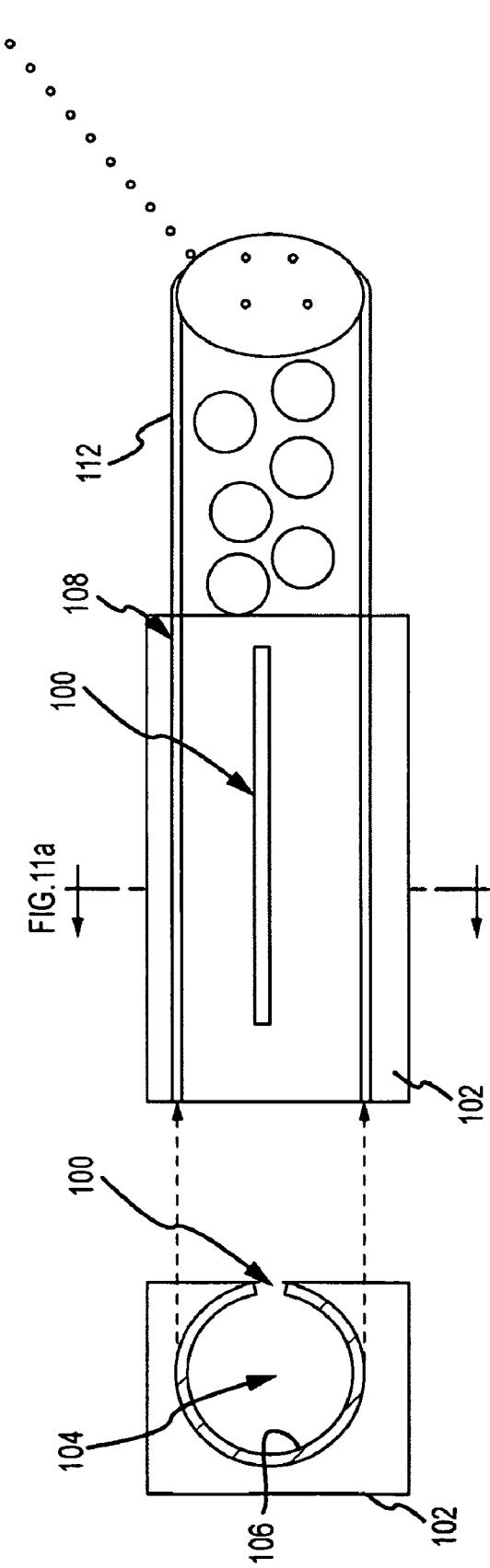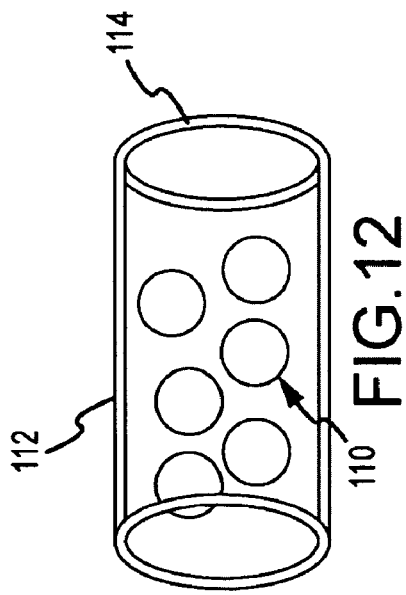

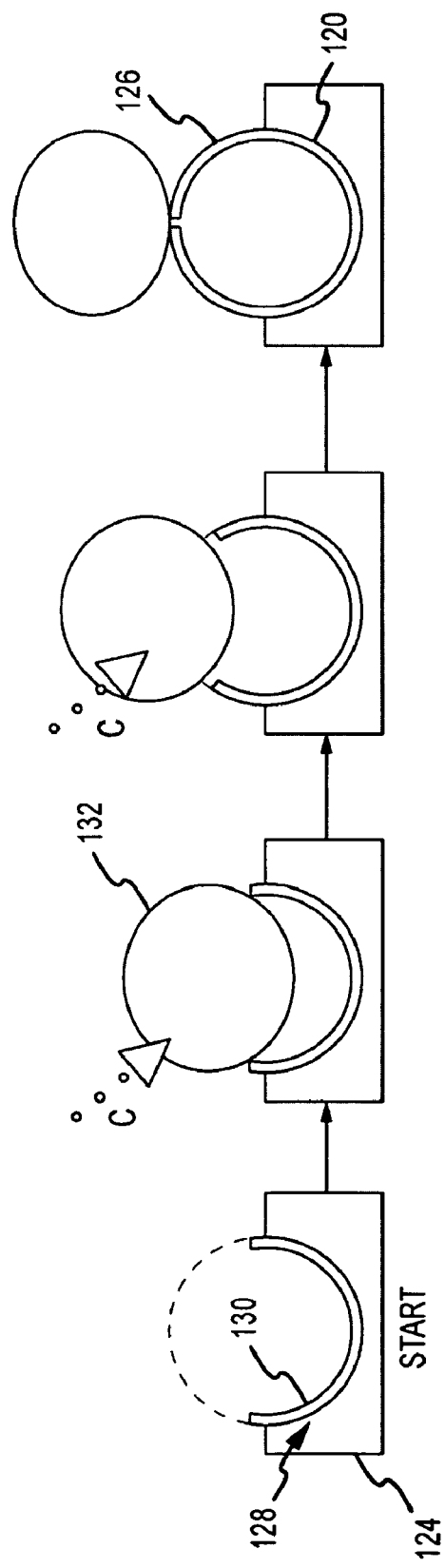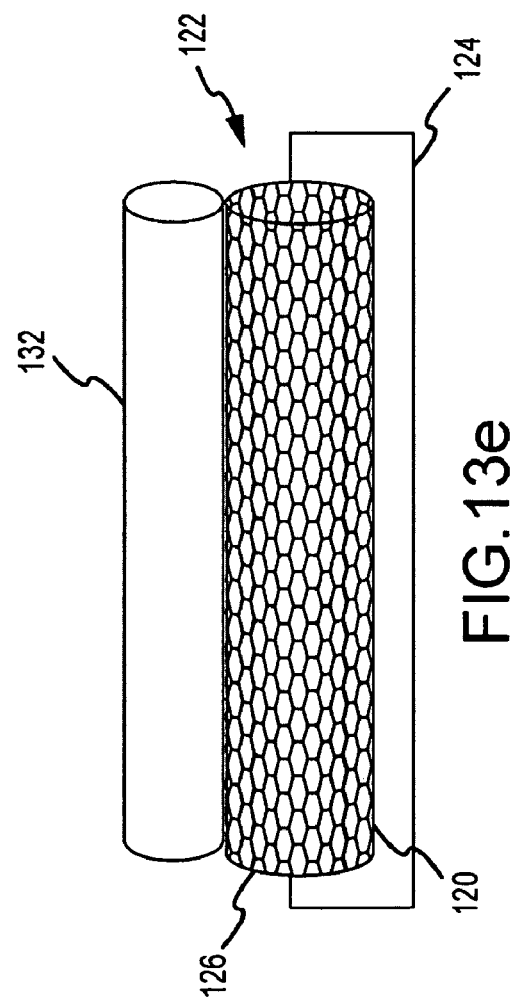

EPITAXIAL GROWTH AND CLONING OF A PRECURSOR CHIRAL NANOTUBE

BACKGROUND OF THE INVENTION

1. Field of the Invention

This invention relates to techniques for growing nanotubes from carbon and other materials, and more particularly to a method of epitaxial growth of a nanotube precursor with specified chirality and cloning of the precursor to grow a specified chiral nanotube.

2. Description of the Related Art

Carbon nanotubes (CNTs) have stimulated a great deal of interest in the micro/nano-electronic and other industries because of their unique properties including tensile strengths above 35 GPa, elastic modulus reaching 1 TPa, higher thermal conductivity than diamond, ability to carry 1000× the current of copper, densities below 1.3 g/cm$^3$ and high chemical, thermal and radiation stability. CNTs have great promise for devices such as field effect transistors, field emission displays, single electron transistors in the microelectronic industry, and uses in other industries. Commercialization of CNTs will depend in large part on the ability to grow and network CNTs on a large cost-effective scale without compromising these properties.

A CNT is a hollow cylindrical shaped carbon molecule. The cylindrical structure is built from a hexagonal lattice of sp$^2$ bonded carbon atoms with no dangling bonds. The properties of single-walled nanotubes (SWNTs) are determined by the orientation of the rolled graphene structure in which the carbon atoms are arranged to form the cylinder. Multi-walled nanotubes (MWNTs) are made of concentric cylinders around a common central hollow. The orientation of the hexagonal lattice can exhibit different 'chirality' e.g. armchair, zig-zag, and chiral as specified by their n,m type. The different chiralities exhibit different electrical and thermal conductivities and different growth rates.

CNTs are commonly grown using several techniques such as arc discharge, laser ablation and chemical vapour deposition (CVD). In CVD the growth of a CNT is determined by the presence of a catalyst, usually a transition metal such as Fe, Co or Ni, which causes the catalytic dehydrogenation of hydrocarbons from a carbon-containing growth gas, typically a hydrocarbon $C_xH_y$, such as Ethylene ($C_2H_4$), Methane ($CH_4$), Ethanol ($C_2H_5OH$), or Acetylene ($C_2H_2$) or possibly a non-hydrocarbon such as carbon-monoxide (CO), and consequently the formation of a CNT which also matches the symmetry and lattice constants of the catalyst. CVD is relatively easy to scale up and can be integrated with conventional microelectronic fabrication, which favors commercialization.

The way in which nanotubes are formed at the atomic scale is not precisely known. The detailed growth mechanism is still a subject of scientific debate, and more than one mechanism might be operative during the formation of CNTs. A catalyst is deposited on a support such as silicon, zeolite, quartz, or inconel. At elevated temperatures, exposure to a carbon containing gas causes the catalyst to take in carbon, on either the surfaces, into the bulk, or both. This thermal diffusion process of neutral carbon atoms occurs at energies of a few electronvolts (eV). A precursor to the formation of nanotubes and fullerenes, $C_2$, is formed on the surface of the catalyst. From this precursor, a rodlike carbon is formed rapidly, followed by a slow graphitization of its wall. The CNT can form either by 'extrusion' (also know as 'base growth' or 'root growth') in which the CNT grows upwards from the catalyst that remains attached to the support, or the catalytic particles can detach from the substrate and move at the head of the growing nanotube, labelled 'tip-growth'. Depending on the size of the catalyst particle either SWNT or MWNT are grown. A typical catalyst may contain an alloy of Fe, Co or Ni atoms having a total diameter of 1 to 100 nm (on the order of 1,000 atoms for 1 nm diameter of catalyst). The diameter of the CNT also depends on the diameter of the catalyst but cannot be precisely controlled. Furthermore, the carbon nanotubes will exhibit different chiralities somewhat randomly across an array.

Conventional nanotube growth techniques produce arrays of hundreds of thousands to tens of millions of nanotubes in which the chirality of the nanotubes varies randomly throughout the array. In many applications, either a uniform chirality whatever it may be or a particular chirality is required or at least desired. Currently, this requires the use of an atomic force microscope and many hours of labor to sift through the free nanotubes once they are harvested to extract those of a desired chirality. More recently chemical methods have been developed to sort based on chirality but these methods are expensive, time consuming and also involve dangerous poisons.

Richard E. Smalley et al. "Single Wall Carbon Nanotube Amplification: En Route to a Type-Specific Growth Mechanism" J. Am Chem Society Nov. 15, 2006, 128, 15824-15829 describes a technique to mass produce any specific n,m type of SWNT from a small sample of the same material. The ultimate protocol would involve taking a single n,m-type nanotube sample, cutting the nanotubes in that sample into many short nanotubes, using each of those short nanotubes as a template for growing much longer nanotubes of the same type, and then repeating the process.

SUMMARY OF THE INVENTION

The present invention provides a new method for growing and cloning precursor chiral nanotubes with a specified chirality.

This is accomplished by first specifying the design of the desired nanotube including the material selected from Carbon, Nitrogen, Boron, Titanium, Silicon, Germanium, Aluminum and Gallium and combinations thereof, chirality and typically the diameter. Given the specifications of the nanotube, a substrate of crystal material having sheet lattice properties complementary to the lattice properties of the selected material is provided. A cylindrical surface of the specified diameter (1 to 100 nm) is formed as either a void in the substrate or as crystal material projecting from the substrate. The cylindrical surface is formed at an orientation with respect to the axes of the crystal substrate corresponding to the specified chirality. A monocrystalline film of the selected material is epitaxially grown on the cylindrical surface that takes on the sheet lattice properties and orientation of the crystal substrate to form the specified precursor chiral nanotube in or on the crystal substrate. The precursor chiral nanotube may have its own utility or may be used to clone itself. The precursor is cloned by attaching a catalyst to the precursor and dissolving atoms of the specified material into the catalyst, which clone both the sheet lattice properties and orientation of the precursor. Typically, the cloned chiral nanotubes will be harvested by separating them from the substrate allowing the precursor to be reused. Alternately, the cloned nanotube and precursor nanotube embedded in the substrate may have utility as a unit. In addition to growing SWNT or MWNTs with a specified chirality, this approach can be used to grow concentric cylinders of a specified geometry and cylinders in which a first portion is embedded in the crystal along the length of the nanotube. The approach also provides a mechanism for the introduction of other materials into the nanotube.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1 is a diagram of a carbon nanotube having an armchair chirality;

FIG. 2 is a diagram of an iridium crystal substrate having sheet lattice properties complementary to epitaxial growth of a monocrystalline graphene sheet;

FIG. 4 is a section view of an iridium crystal substrate having sheet lattice properties complementary to epitaxial growth of graphene;

FIG. 5 is a section view of cylindrical surfaces formed as voids into or material projecting from the substrate having the specified diameter and chirality of the carbon nanotube;

FIG. 6 is a section view of epitaxially-grown precursor nanotubes on the cylindrical surfaces;

FIGS. 11a and 11b are different section views of a cylindrical nanotube formed with a slot in the precursor nanotube;

FIG. 12 is a view of the cylindrical nanotube including a material introduced through the slot; and FIGS. 13a-13e are a sequence of views illustrating the cloning of a cylindrical nanotube in which a portion of the nanotube is embedded in the substrate and a portion is not.

DETAILED DESCRIPTION OF THE INVENTION

Figure 3A:
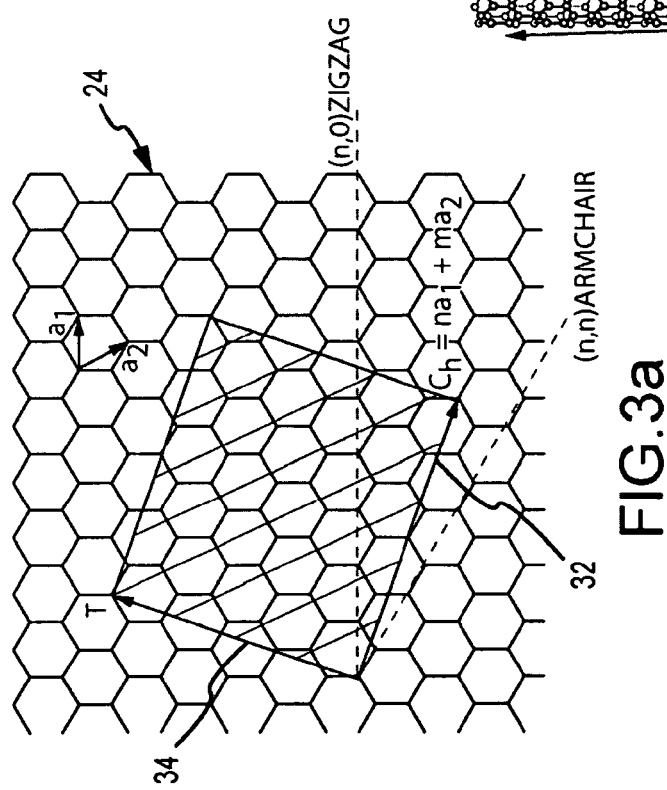
FIGS. 3a and 3b are diagrams illustrating the orientation with which the graphene sheet is rolled to form the carbon nanotube with different chiralities.

The present invention provides a new method for growing and cloning precursor chiral nanotubes with a specified chirality. Arrays of nanotubes having the same and selected chirality may be grown saving considerable amounts of tedious labor and eliminating wasted material. Arrays of nanotubes having a selected mixture of certain chiralities can be grown. Arrays of precursor nanotubes having selected chiralities in a specified geometry in the crystal substrate can be grown. The method improves control over nanotube geometry, particular the desired diameter of the nanotube. The method may also be used to introduce other materials inside the nanotubes for applications such as drug delivery and can be used to produce hybrid nanotubes a portion of which are free and a portion of which are embedded in crystal for applications such as nanoelectronics.

This method involves forming cylindrical surfaces as voids in or as material projecting from an epitaxially-compatible crystal substrate having lattice properties complementary to the nanotube to be grown. The cylindrical surfaces are formed at an orientation with respect to the axes of the crystal substrate that corresponds to the (m,n) vectors orientation of the selected chirality. A monocrystalline film (sheet) of the selected material is epitaxially grown on the cylindrical surface and takes on the sheet lattice properties and orientation of the crystal substrate to form the precursor chiral nanotube. This epitaxially technique provides great flexibility to configure the nanotubes for particular applications in ways previously not contemplated.

The epitaxial-based method can be used to grow and clone precursor chiral nanotubes of materials selected from Carbon, Nitrogen, Boron, Titanium, Silicon, Germanium, Aluminum and Gallium and combinations thereof. Other materials may be found that are also suitable for growing nanotubes in general, and particularly with the described method. Without loss of generality, the invention will be illustrated and described for a particular embodiment of a Carbon nanotube (CNT).

As shown in FIG. 1, a CNT 10 is a hollow cylindrical shaped carbon molecule. The cylindrical structure is built from a hexagonal lattice 12 of $sp^2$ bonded carbon atoms 14 with no dangling bonds. In an unrolled sheet, the hexagonal lattices 12 are arranged in a hexagonal close packed lattice. The nanotube properties are determined by the orientation of the rolled graphene structure in which the carbon atoms are arranged to form the cylinder. The orientation of the hexagonal lattice can exhibit different 'chirality' e.g. armchair, zigzag, and chiral as specified by their (n,m) type. The different chiralities exhibit different electrical and thermal conductivities. As depicted, CNT 10 has an armchair chirality.

The first step is to select the nanotube properties including the material, which determines the lattice constant 16 (bond length between atoms) and bond symmetry 12 of the atoms (e.g. hexagonal), the chirality and the diameter of the nanotube, which can range from approximate 1 micron to approximately 100 microns.

As illustrated in FIG. 2, the second step is to select a crystal material 20 having sheet lattice properties (lattice constant and symmetry of bonded atoms 22) complementary to the lattice properties of the selected material. Typically, the crystal material and nanotube materials are different materials. Their lattice properties do not match. The crystal material is complementary in that an epitaxially-grown monocrystalline film 24 of the nanotube material that takes on the sheet lattice properties of the crystal material 20 exhibits the desired lattice properties of the nanotube. As depicted the crystal material 20 is iridium. Other materials such as ruthenium or other transition metal substrates are also epitaxially-compatible for carbon growth. The carbon atoms 14 are grown above the iridium crystal in an ordered manner in a hexagonal lattice in a close packed arrangement to form a graphene sheet. The lattice constant and symmetry of the monocrystalline film matches that for the selected nanotube.

Figure 3B:
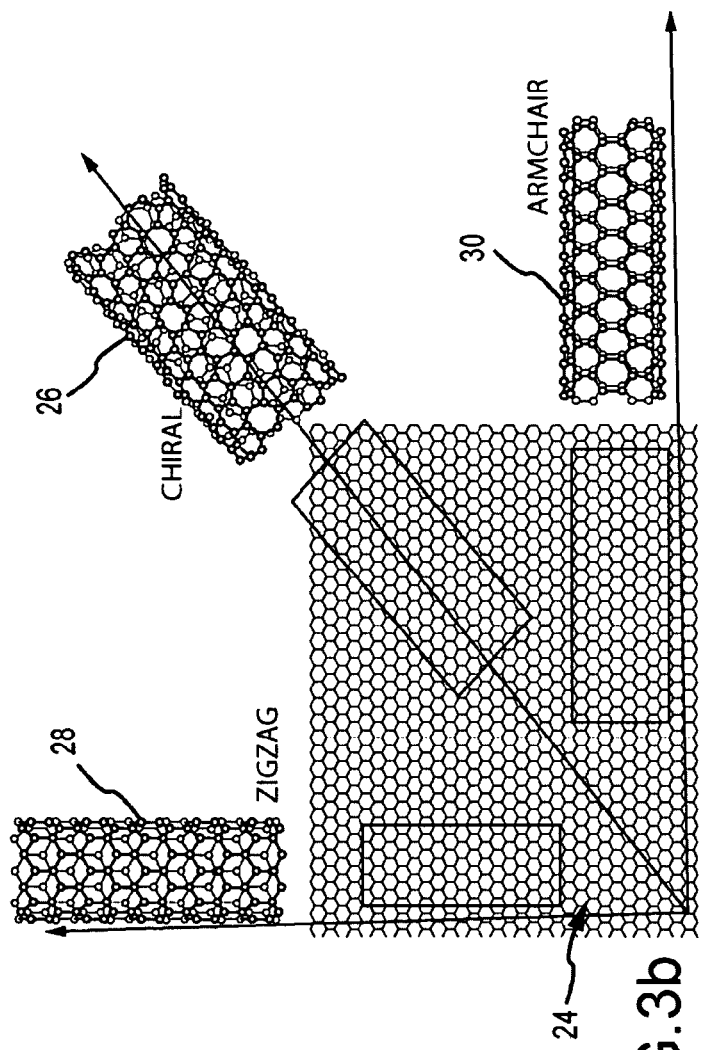

As illustrated in FIGS. 3a and 3b, the third step is to determine the orientation of the cylindrical surface to be formed as a void in the substrate or as material projecting from the substrate so that the epitaxially-grown film exhibits the selected chirality. When the film or sheet 24 is rolled the edges must match the molecular pattern of the lattice. There are many ways to match the lattice, each representing a different chirality. The general chirality (m,n) is simply referred to as 'chiral' 26 where m and n are different integers. Zigzag 28 and armchair 30 are special cases in which n=0 and m is an integer and n=m, respectively. The (n,m) naming scheme can be thought of as a vector (Ch) 32 in a finite film or sheet that describes how to 'roll up' the film to the make the nanotube. T denotes the axis 34 of the cylinder and a1 and a2 are the unit vectors of the film in real space. The orientation of the cylindrical surface is given by the Ch vector defined by the (m,n).

To epitaxially grow a precursor nanotube having a zigzag chirality, a cylindrical void is formed perpendicular to the substrate and so forth.

Once the crystal material and orientation of the cylindrical surface have been determined for a particular nanotube, a substrate 40 of the selected material, in this example iridium, is provided as shown in FIG. 4. The substrate may be selected to support the growth of anywhere from a single precursor chiral nanotube to billions of precursor chiral nanotubes of the same or different geometries and chiralities.

As shown in FIG. 5, cylindrical surfaces are formed as voids in the substrate or as crystal material projecting from the substrate 40 with an orientation with respect to the axes of the crystal substrate corresponding to the selected chirality. To illustrate the flexibility of the approach, void cylindrical surfaces 42, 44 and 46 corresponding to zigzag, armchair and chiral chiralities, respectively, are formed. In addition a projected cylindrical surface 48 and void concentric cylindrical surfaces 50 and 52 having zigzag chirality are formed. There are various techniques for forming nano-scale voids or projections. One such approach is ion milling or drilling which currently can provide feature sizes as small as approximately 1 nanometer with an accuracy of approximately ½ nanometer. For typical nanotube diameters, this approach can provide a much tighter tolerance to a selected diameter than CVD growth from a catalytic particle.

As shown in FIG. 6, a monocrystalline film or, in the case of carbon, a graphene sheet 60 is epitaxially grown on the cylindrical surfaces in crystal substrate 40 to form precursor chiral nanotubes 64. The graphene sheet would in general cover the entire surface of the substrate unless, as depicted here, the uninvolved surfaces are treated to prevent epi-growth. Epitaxy refers to the method of depositing a monocrystalline film on a monocrystalline substrate. The deposited film is denoted as epitaxial film or epitaxial layer. The term epitaxy comes from a Greek root (epi "above" and taxis "in ordered manner") which could be translated to "arrange upon". Because the substrate acts as a seed crystal, the deposited film takes on a lattice structure and orientation identical to those of the substrate. Therefore, the substrate crystal material must be selected to have a lattice structure complementary to the desired nanotube. This is different from other thin-film deposition methods which deposit polycrystalline or amorphous films, even on single-crystal substrates.

The atoms 64 required to grow the graphene sheets 60 may be provided from gaseous or liquid precursors, via ion implantation or by diffusion. For example, a CVD process can be used to expose the iridium crystal to a hot benzene vapor. The hydrogen atoms break away upon striking the iridium crystal leaving a single atomic layer of carbon atoms on the cylindrical surfaces of iridium crystal. Only one layer is grown because the catalytic removal of hydrogen is stopped as soon as graphene forms a single barrier layer. Peter W. Sutter et al "Epitaxial Graphene on Ruthenium", nature materials, Vol 7, May 2008 pp. 406-411 describes a method of epitaxial growth of graphene by diffusing carbon into bulk ruthenium and then reducing the temperature until the carbon begins to precipitate on the surface of the ruthenium and forms a single layer of graphene. In many applications a single layer or "wall" is desired. Sutter discloses that further addition of carbon results in a double layer with a displaced lattice, which can be used to form multiple layers or walls.

Figure 7:
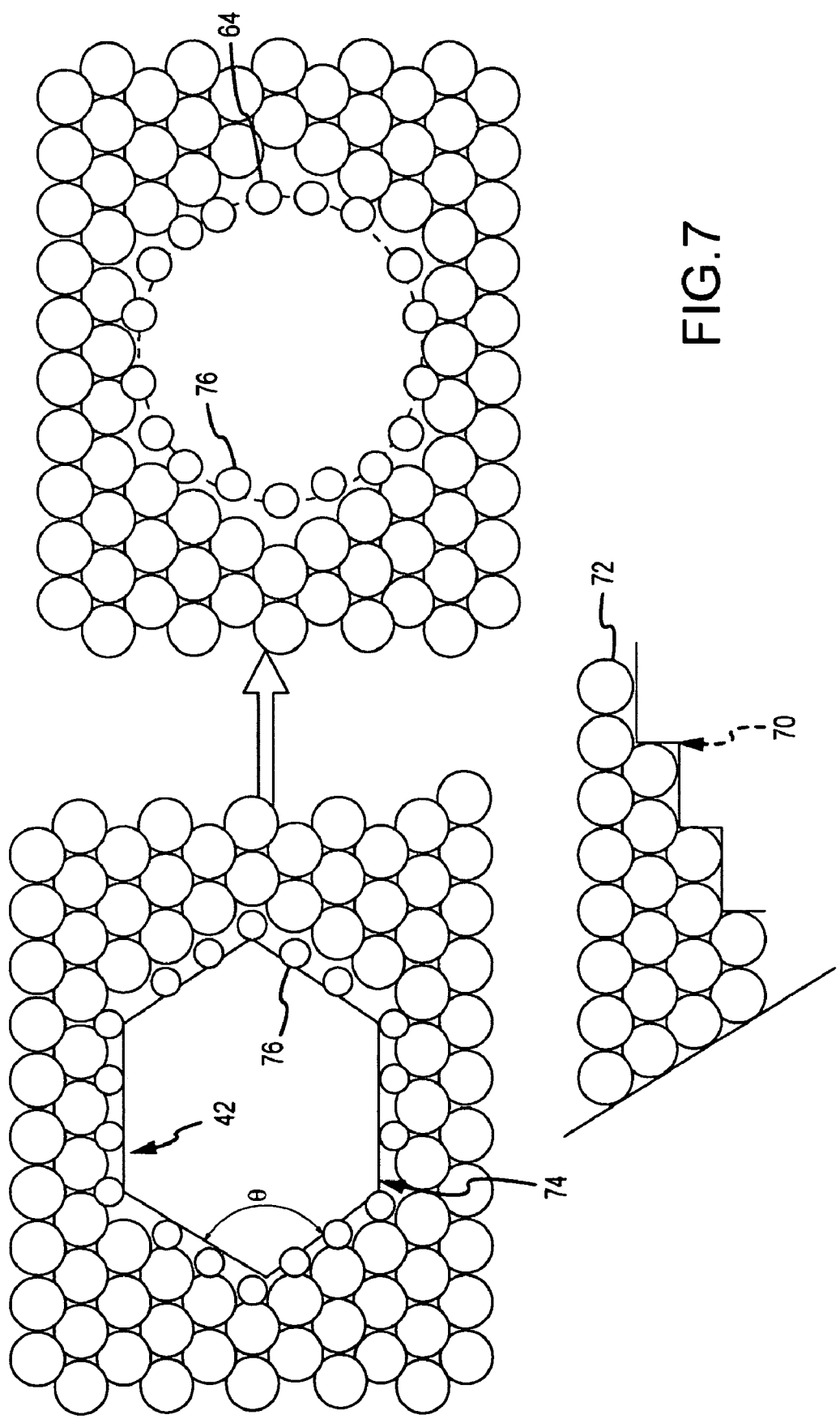
FIG. 7 is a cross section view of a precursor chiral nanotube epitaxially-grown in the iridium crystal substrate.

Prior to actual experiments to perform the epitaxial growth of a graphene sheet on the cylindrical surfaces of the iridium crystal it was unknown whether the resulting precursor chiral nanotube 64 would exhibit the smoothly bent lattice of CNT 10 depicted in FIG. 1. As shown in FIG. 7 (cross-section looking along the axis of the cylinder), the cylindrical surface 42 formed in the iridium crystal is not a smooth surface at the atomic level. The surface is formed by step-defects 70 between adjacent iridium atoms 72. These step-defects create crystal planes 74 defined by the iridium atoms 72 that create a hexagonal symmetry at the atomic level. If the epitaxially grown carbon atoms 76 bond to the iridium atoms along the crystal planes as shown on the left side of the figure the precursor chiral nanotube will not exhibit the smoothly bent lattice. However, as experimentation confirmed (as shown on the right side of the figure) the carbon atoms 76 bond in a manner consistent with their lowest energy state which produces the smoothly bent lattice. The carbon-carbon bonds are far stronger than the carbon-iridium bonds. This will be true for the contemplated nanotube materials and complementary crystal substrate materials. To grow a 1 nm diameter CNT requires about five step defects. Larger diameter tubes require fewer steps. Experimentation shows that the smoothly bent lattice can be formed for up to ten steps. So even though the curved crystal surfaces have significant step-defects, the epi-grown graphene sheet is consistent with the bent lattice of a CNT and will continue the epitaxial growth on stepped (curved surfaces).

The precursor chiral nanotube(s) embedded in or on crystal material may have applications in a wide variety of fields. The formation of nanotubes in a crystal material may be used in, for example, nanoelectronics or other nanotube network applications.

Another use for the crystal substrate and precursor chiral nanotube(s) is as a template to clone chiral nanotubes. The chiral nanotubes can be harvested and the template reused. Alternately, the combination of precursor chiral nanotubes embedded in crystal with chiral nanotubes outside the crystal may also find application in a wide variety of fields.

Figure 8:
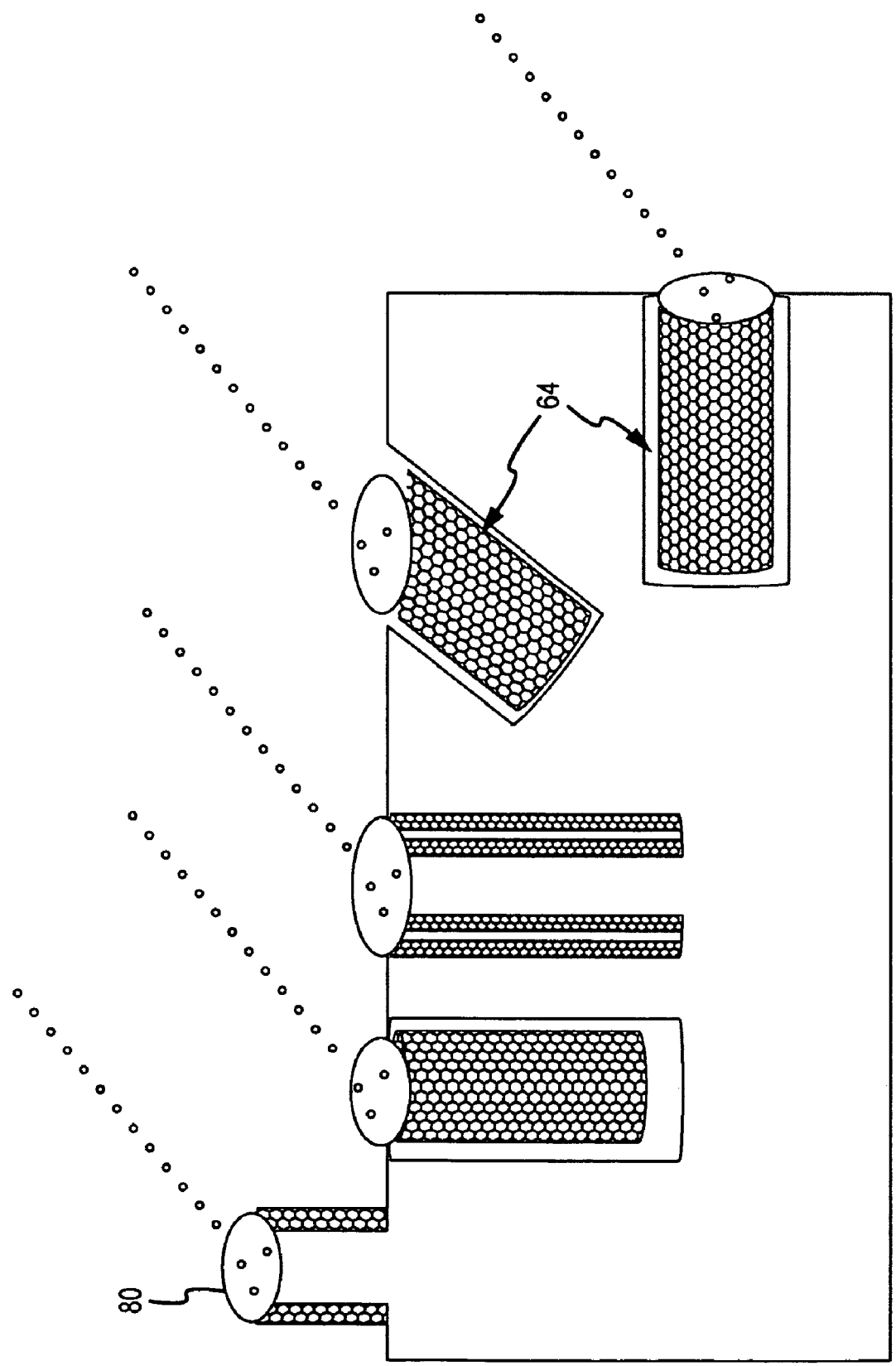
FIG. 8 is a section view of carbon atoms being dissolved into catalysts placed on exposed portions of the precursors nanotubes to clone the precursor nanotubes.
Figure 9:
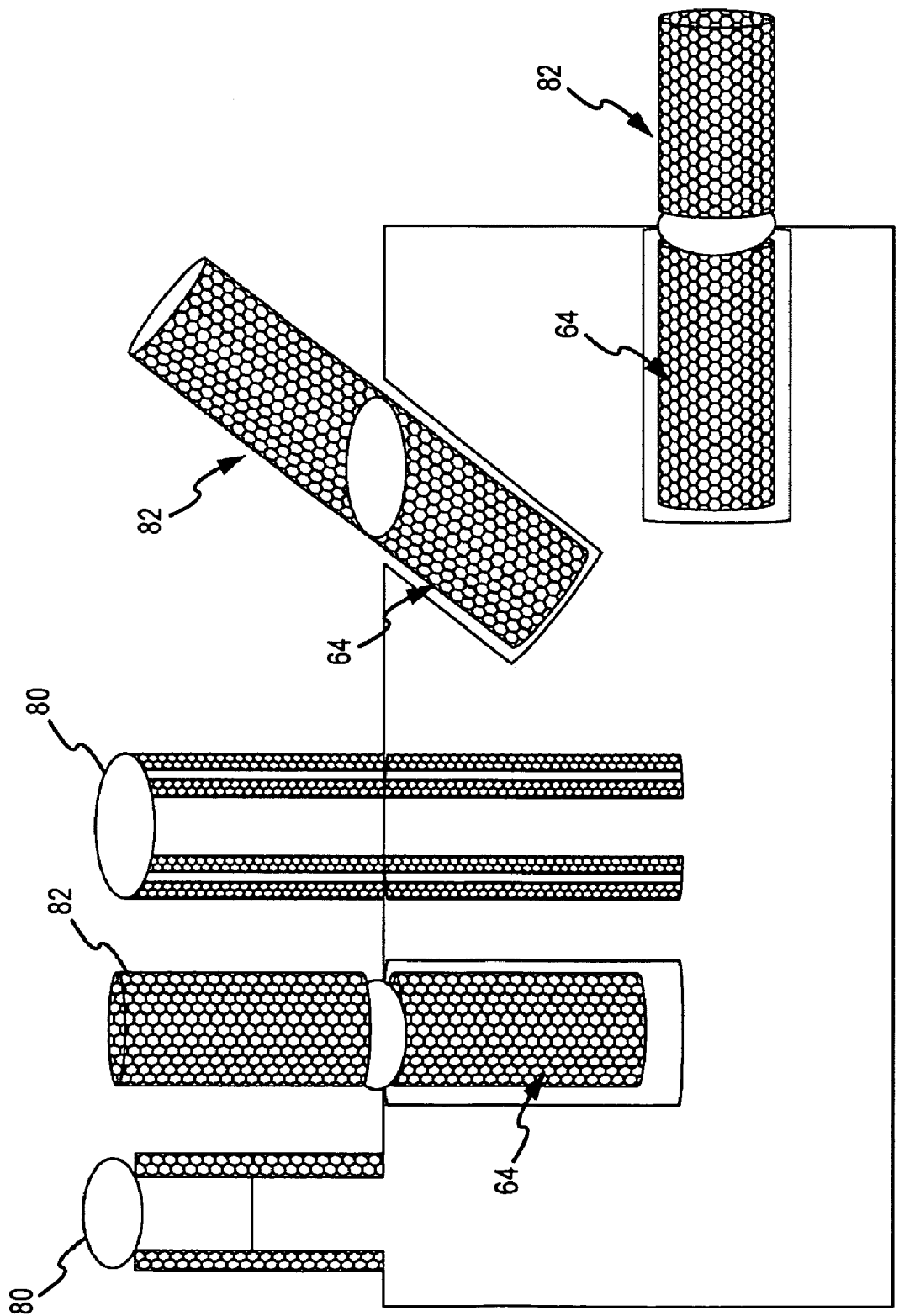
FIG. 9 is a section view of cloned nanotubes and their precursor nanotubes.

As illustrated in FIGS. 8 and 9, to clone the precursor chiral nanotubes catalytic material 80 is placed on the end of the precursor chiral nanotubes. The catalytic material is suitably a single 3D catalytic particle 1 to 100 nm in diameter depending on the diameter of the nanotube. Fe, Co and Ni are typical catalytic materials that provide the requisite solubility and fast diffusion of the atoms. Atoms of the selected material are then dissolved into the catalytic particle 80 to clone a chiral nanotube 82 from the precursor chiral nanotube 64. Growth of the cloned chiral nanotube 64 may be via root or tip growth. The atoms may be "dissolved" into the catalyst using CVD or ion implantation methods.

A catalyst works by providing an alternative reaction pathway to the reaction product. The rate of the reaction is increased as this alternative route has lower activation energy than the reaction route not mediated by the catalyst. The lower the activation energy, the faster the rate of the reaction. The catalyst also serves to separate the carbon atom from the rest of the hydrocarbon molecule (generally the material atom the carrier molecule) and move it slowly by diffusion to the proper position at the end of the growing nanotube.

Figure 10:
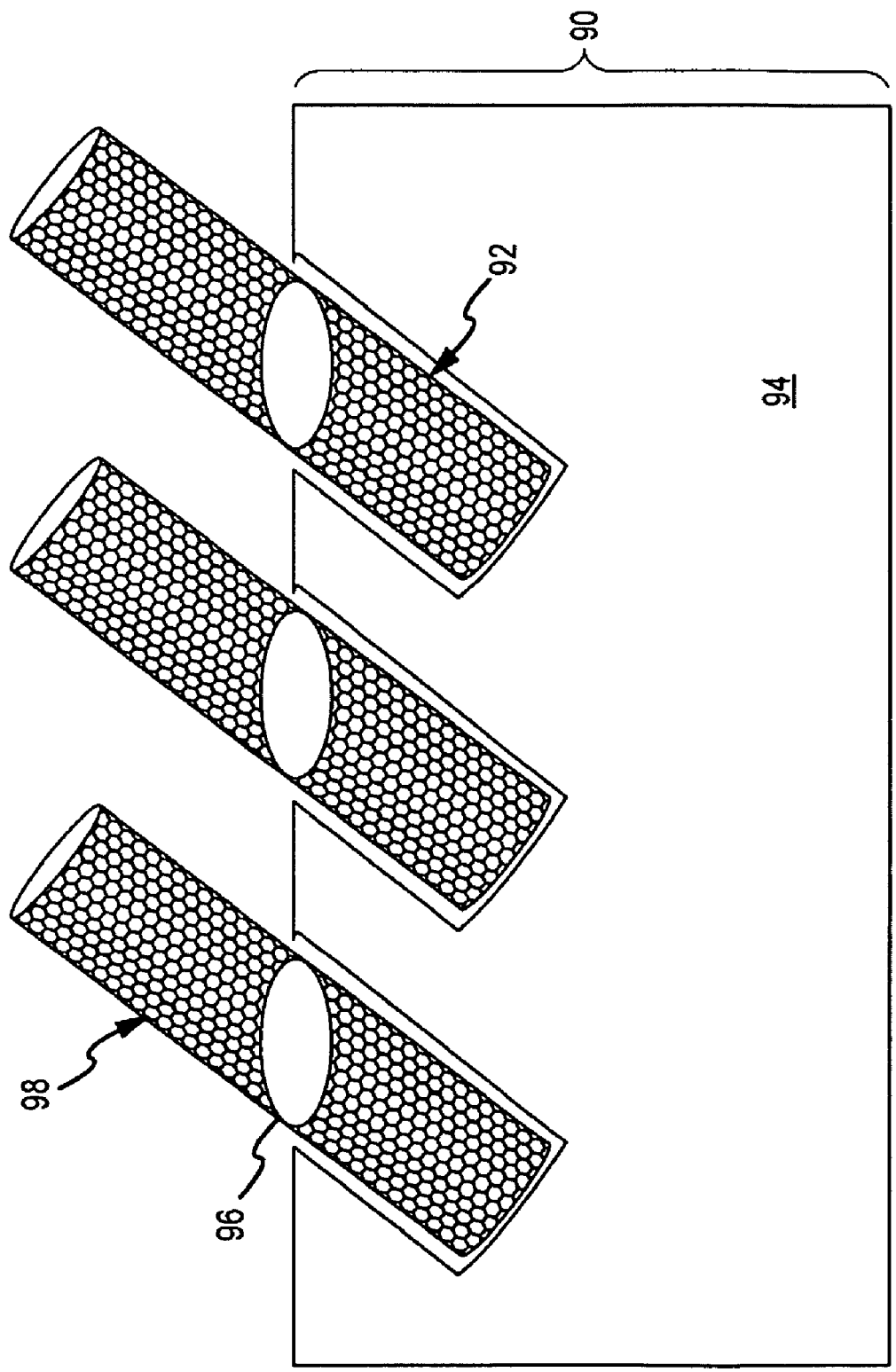
FIG. 10 is a diagram of an array of precursor and cloned chiral nanotubes of a single specified chirality.

A particularly useful application of the described epitaxial-growth technique is to form a template 90 to grow arrays of nanotubes having the same selected chirality as shown in FIG. 10. Template 90 includes an array of precursor chiral nanotubes 92 embedded in (or on) a crystal substrate 94. An inventory of templates having different chiralities could be maintained. To grow nanotubes of a desired chirality, one simply selects the appropriate template 90, places catalytic particles 96 on the precursor nanotubes and dissolves atoms of the selected material into the catalytic particle to grow an array of chiral nanotubes 98 that can be harvested. The efficiency and uniformity of producing an array of nanotubes having the same chirality using this approach is vastly superior to using an atomic force microscope to sift through vast numbers of nanotubes to find ones with the proper chirality. Furthermore, this technique provides the ability to control the diameter and length of the nanotubes uniformly across the array.

FIGS. 11a-b and 12 illustrate a variation on the base epitaxial-growth process whereby other materials such as organics or energetic materials may be introduced inside the precursor and/or cloned nanotube. As shown an opening 100 is formed through the wall of the crystal substrate 102 to the cylindrical void 104 inside the substrate. The graphene sheet 106 is formed with the same opening thereby providing access inside the precursor nanotube 108. Additional material 110 is inserted through opening 100 into the precursor nanotube and into the cloned nanotube 112. This can be done during the cloning process or after prior to harvesting nanotube 112. Depending upon the size of nanotube 112 and the nature of the material 110 the ends of the nanotube may or may not need to be capped. 114. This approach could prove to be an effective solution for drug delivery, for example.

FIGS. 13a through 13e illustrate another variation on the base epitaxial-growth process whereby a portion 120 of a hybrid chiral nanotube 122 is embedded in the crystal substrate 124 and the remaining portion 126 of the nanotube is not along the length of the nanotube. As shown, the cylindrical surface formed as a void in the substrate is formed as a 'trough' 128. The trough may be a ½ cylinder, more or less depending on the application. A monocrystalline film 130 is grown on the surface of the trough to form precursor nanotube portion 120. A catalytic rod 132 is placed on top of and along the length of the precursor. As atoms are dissolved into the catalyst, the material grows to complete the remaining portion 126 of the nanotube 122. A hybrid chiral nanotube may find applications in nanoelectronics and other fields.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of growing a precursor chiral nanotube from a selected material and with a selected chirality, comprising:
   providing a substrate of crystal material having sheet lattice properties complementary to the lattice properties of the selected material;
   forming a cylindrical surface from the crystal material having a diameter of 1 to 100 nanometers as a void in the substrate or as a projection from the substrate with an orientation with respect to the axes of the crystal substrate corresponding to the selected chirality; and
   epitaxially growing a monocrystalline film of the selected material on the cylindrical surface that takes on the sheet lattice properties and orientation of the crystal substrate to form the precursor chiral nanotube with the selected chirality.

2. The method of claim 1, wherein the material is selected from Carbon, Nitrogen, Boron, Titanium, Silicon, Germanium, Aluminum and Gallium and combinations thereof.

3. The method of claim 1, wherein the material is Carbon.

4. The method of claim 1, wherein the cylindrical surface is formed with a vertical orientation with respect to the axes of the crystal substrate corresponding to a zigzag chirality (n,m) where n=0 and m is an integer.

5. The method of claim 1, wherein the cylindrical surface is formed with a horizontal orientation with respect to the axes of the crystal substrate corresponding to an armchair chirality (n,m) where n and m have the same integer value.

6. The method of claim 1, wherein the cylindrical surface is formed with a diagonal orientation with respect to the axes of the crystal substrate corresponding to a chiral chirality (n,m) where n and m have different integer values.

7. The method of claim 1, wherein multiple identical cylindrical surfaces are formed in the substrate with the same orientation for epitaxial growth of an array of precursor chiral nanotubes having the same selected chirality.

8. The method of claim 1, further comprising:
   forming an opening in the crystal substrate to the cylindrical void, said epitaxially grown precursor chiral nanotube having a hole coincident with said opening; and
   injecting a material through said opening and hole into the nanotube precursor.

9. The method of claim 1, wherein the cylindrical surface is a portion of a cylindrical void into the crystal substrate whose axis extends across the surface of the substrate, said selected material epitaxially grown on the inner surface of the crystal substrate to form a portion of a cylindrical nanotube precursor.

10. The method of claim 1, further comprising:
    placing a catalytic particle on an exposed portion of the precursor chiral nanotube; and
    dissolving atoms of the selected material into the catalytic particle to clone a chiral nanotube from the precursor chiral nanotube.

11. A method of growing a chiral nanotube, comprising:
    selecting a material and chirality for a chiral nanotube;
    providing a substrate of crystal material having sheet lattice properties complementary to the lattice properties of the selected material for the chiral nanotube;
    forming a cylindrical surface from the crystal material having a diameter of 1 to 100 nanometers as a void in the substrate or as a projection from the substrate with an orientation with respect to the axes of the crystal substrate corresponding to the selected chirality;
    epitaxially growing a monocrystalline film of the selected material on the cylindrical surface that takes on the sheet lattice properties and orientation of the crystal substrate to form a precursor chiral nanotube with the selected chirality;
    placing a catalytic particle on an exposed portion of the precursor chiral nanotube; and
    dissolving atoms of the selected material into the catalytic particle to clone a chiral nanotube with the selected chirality from the precursor chiral nanotube.

12. The method of claim 11, wherein the material is selected from Carbon, Nitrogen, Boron, Titanium, Silicon, Germanium, Aluminum and Gallium and combinations thereof.

13. The method of claim 11, wherein multiple identical cylindrical surfaces are formed in the substrate for epitaxial growth of an array of precursor chiral nanotubes having the same selected chirality.

14. A method of growing a precursor nanotube from a selected material and geometry, comprising:
    providing a substrate of crystal material having sheet lattice properties complementary to the lattice properties of the selected material;
    forming a curved surface from the crystal material having a diameter of 1 to 100 nanometers as a void in the substrate or as a projection from the substrate complementary to the selected geometry; and
    epitaxially growing a monocrystalline film of the selected material on the curved surface that takes on the sheet lattice properties and geometry of the crystal substrate to form the precursor nanotube.

15. The method of claim 1, wherein the step of forming the cylindrical surface comprises:
   removing the crystal material from the substrate to form the void in the substrate or the projection from the substrate.

16. The method of claim 1, wherein the monocrystalline film takes on the sheet lattice properties including the lattice constant and symmetry of bonded atoms of the crystal material of the substrate.

17. The method of claim 11, wherein the step of forming the cylindrical surface comprises:
   removing the crystal material from the substrate to form the void in the substrate or the projection from the substrate.

18. The method of claim 11, further comprising harvesting the cloned chiral nanotube leaving the precursor chiral nanotube as a template.

19. A method of growing a precursor chiral nanotube from a selected material and with a selected chirality, comprising:
   providing a substrate of crystal material having sheet lattice properties complementary to the lattice properties of the selected material;
   removing crystal material from the substrate to form a cylindrical surface from the crystal material having a diameter of 1 to 100 nanometers as a void in the substrate or as a projection from the substrate with an orientation with respect to the axes of the crystal substrate corresponding to the selected chirality; and
   epitaxially growing a monocrystalline film of the selected material on the cylindrical surface to form the precursor chiral nanotube with the selected chirality.

20. The method of claim 19, wherein multiple identical cylindrical surfaces are formed from the crystal material with the same orientation for epitaxial growth of an array of precursor chiral nanotubes having the same selected chirality.

* * * * *